(12) United States Patent
Sakamoto et al.

(10) Patent No.: US 8,472,187 B2
(45) Date of Patent: Jun. 25, 2013

(54) DISPLAY APPARATUS

(75) Inventors: Takeshi Sakamoto, Tokyo (JP); Yusuke Mori, Chiba (JP); Jun Katsunuma, Kanagawa (JP)

(73) Assignee: Sony Corporation, Tokyo (JP)

( * ) Notice: Subject to any disclaimer, the term of this patent is extended or adjusted under 35 U.S.C. 154(b) by 182 days.

(21) Appl. No.: 13/011,333

(22) Filed: Jan. 21, 2011

(65) Prior Publication Data

US 2011/0188186 A1 Aug. 4, 2011

(30) Foreign Application Priority Data

Jan. 29, 2010 (JP) ................................. 2010-019085

(51) Int. Cl.
*G06F 1/16* (2006.01)
(52) U.S. Cl.
USPC ................. 361/679.59; 361/679.21; 248/917; 248/923
(58) Field of Classification Search
USPC .................................................... 361/679.59
See application file for complete search history.

(56) References Cited

U.S. PATENT DOCUMENTS

| | | | | |
|---|---|---|---|---|
| 5,582,373 A | * | 12/1996 | Baudot | 248/166 |
| 6,028,764 A | * | 2/2000 | Richardson et al. | 361/679.29 |
| 6,301,101 B1 | * | 10/2001 | Anzai et al. | 361/679.3 |
| 7,614,596 B2 | | 11/2009 | Takao | |
| 7,898,796 B2 | * | 3/2011 | Horie | 361/679.02 |
| 8,201,687 B2 | * | 6/2012 | Zeliff et al. | 206/320 |
| 2005/0051692 A1 | * | 3/2005 | Jung et al. | 248/371 |
| 2006/0050471 A1 | * | 3/2006 | Chen | 361/681 |
| 2006/0050472 A1 | * | 3/2006 | Chen | 361/681 |
| 2006/0077623 A1 | * | 4/2006 | Yeh | 361/681 |
| 2006/0082957 A1 | * | 4/2006 | Chen | 361/681 |

FOREIGN PATENT DOCUMENTS

| | | |
|---|---|---|
| JP | 2008-129390 | 6/2008 |
| JP | 2008-136160 | 6/2008 |
| JP | 2009-122274 | 6/2009 |

\* cited by examiner

*Primary Examiner* — Anthony Q Edwards
(74) *Attorney, Agent, or Firm* — Oblon, Spivak, McClelland, Maier & Neustadt, L.L.P.

(57) ABSTRACT

A display apparatus of present invention includes a tabular display unit having a display screen for displaying an image and a support section constituted by a bent stick member. One end of the support section is inserted into a hole arranged on a back surface of the display unit from a lower side, and the support section is arranged between a placement surface and a lower end of the display unit, whereby the support section supports the display unit from the lower side.

5 Claims, 19 Drawing Sheets

FIG. 22
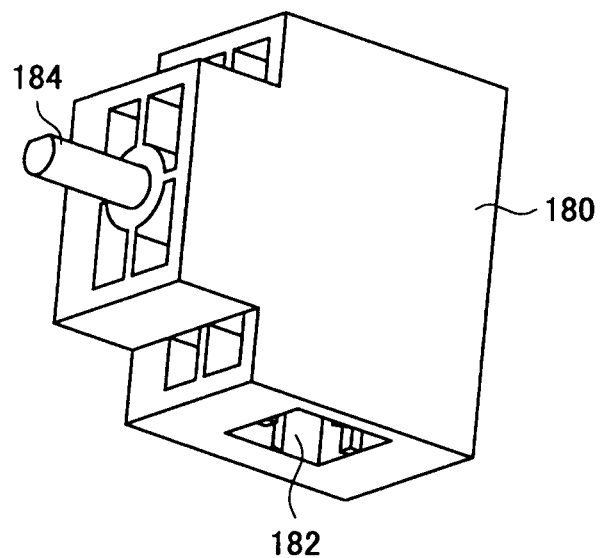
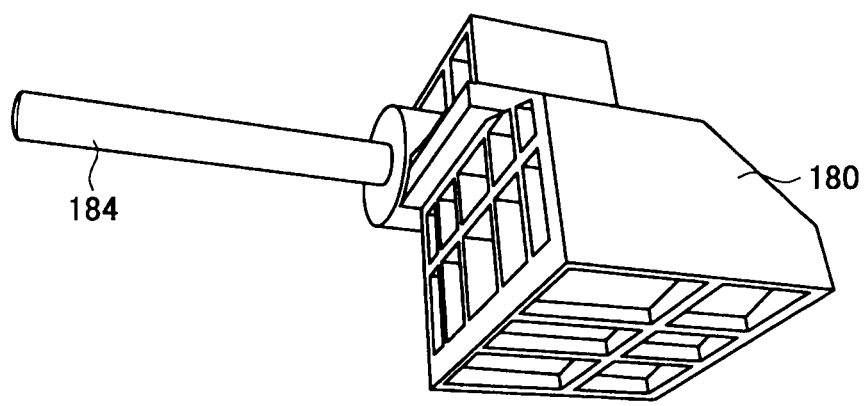

DISPLAY APPARATUS

BACKGROUND OF THE INVENTION

1. Field of the Invention

The present invention relates to a display apparatus.

2. Description of the Related Art

In the past, for example, Japanese Patent Application Laid-Open Nos. 2008-129390, 2008-136160, and 2009-122274 describe a known structure for supporting a display panel. In this known structure, a stand is arranged at a lower portion of a thin display apparatus.

SUMMARY OF THE INVENTION

However, in the technique disclosed in the above listed patent publications, a relatively large stand is necessary to support a display unit arranged with a display screen. Therefore, there is an issue in that the manufacturing cost of the display apparatus increases. In addition, a visual field of a user would include the large stand arranged outside the display screen, and this causes an issue of reducing the visibility of the display screen.

Moreover, when a product or the like is shipped, it is necessary to pack not only the main body of the apparatus having the display screen arranged therein but also the stand. When the stand is large, however, the volume of the packed product increases, which causes an issue of reducing the efficiency of transport.

In view of the foregoing, it is desirable to provide a novel and improved display apparatus having a small and simple structure and capable of supporting the display unit having the display screen arranged therein.

According to an embodiment of the present invention, there is provided a display apparatus includes a tabular display unit having a display screen for displaying an image and a support section constituted by a bent stick member. One end of the support section is inserted into a hole arranged on a back surface of the display unit from a lower side, and the support section is arranged between a placement surface and a lower end of the display unit, whereby the support section supports the display unit from the lower side.

In this configuration, the support section is formed such that a portion coming into contact with the placement surface is formed in a U shape.

In this configuration, the hole formed in the back surface of the display unit includes a plurality of holes having different angles with respect to a vertical direction, and a tilt angle of the display unit can be changed by inserting the one end of the support section into a different hole.

In this configuration, two support sections are respectively arranged at right and left of the display unit, and a pitch adjustment bar is arranged to define a gap between the support sections in order to allow the support sections to be inserted into the two holes having the same angle with respect to the vertical direction.

In this configuration, the back surface of the display unit is provided with a hinge that can rotate in a tilt direction with respect to the display unit, and the one end of the support section is inserted into a hole arranged in the hinge.

According to the present invention, a display apparatus is provided, which has a small and simple structure and can support the display unit having the display screen arranged therein.

BRIEF DESCRIPTION OF THE DRAWINGS

FIG. 22 is a schematic view illustrating an exemplary configuration of a hinge;

DETAILED DESCRIPTION OF THE EMBODIMENT

Figure 1:
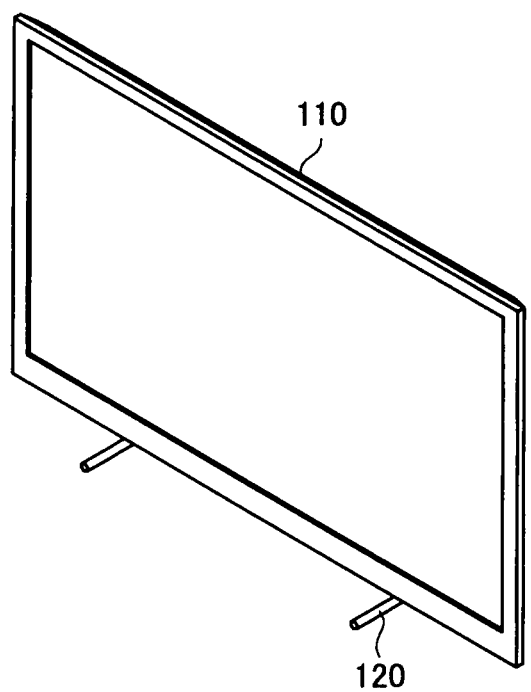
FIG. 1 is a schematic view illustrating an entire structure of a display apparatus according to an embodiment of the present invention.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

The explanation will be made in the following order.
1. Entire structure of display apparatus
2. Details of support structure
3. Exemplary configuration of tilt mechanism <1. Entire Structure of Display Apparatus>

Figure 2:
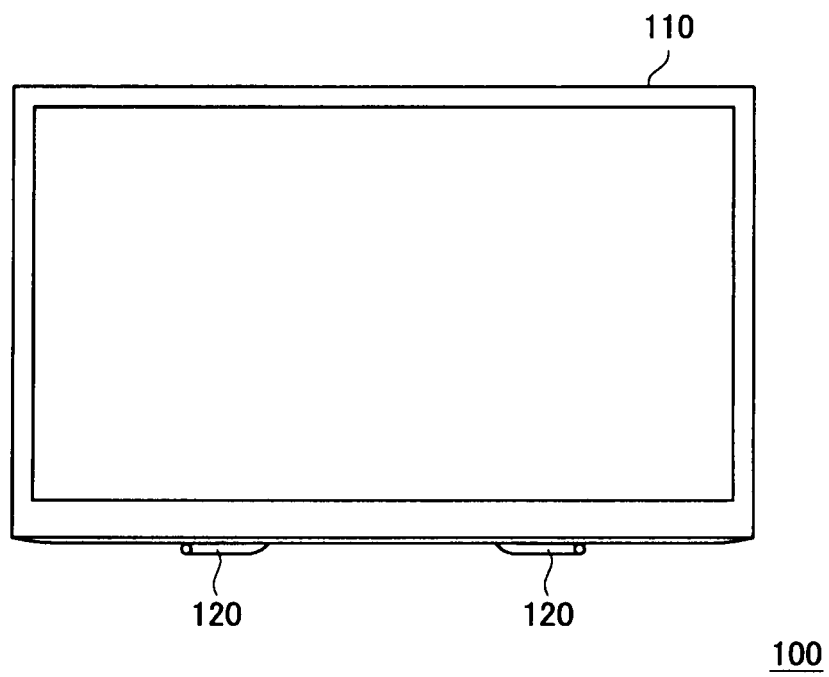
FIG. 2 is a schematic view illustrating the entire structure of the display apparatus according to the embodiment of the present invention.
Figure 3:
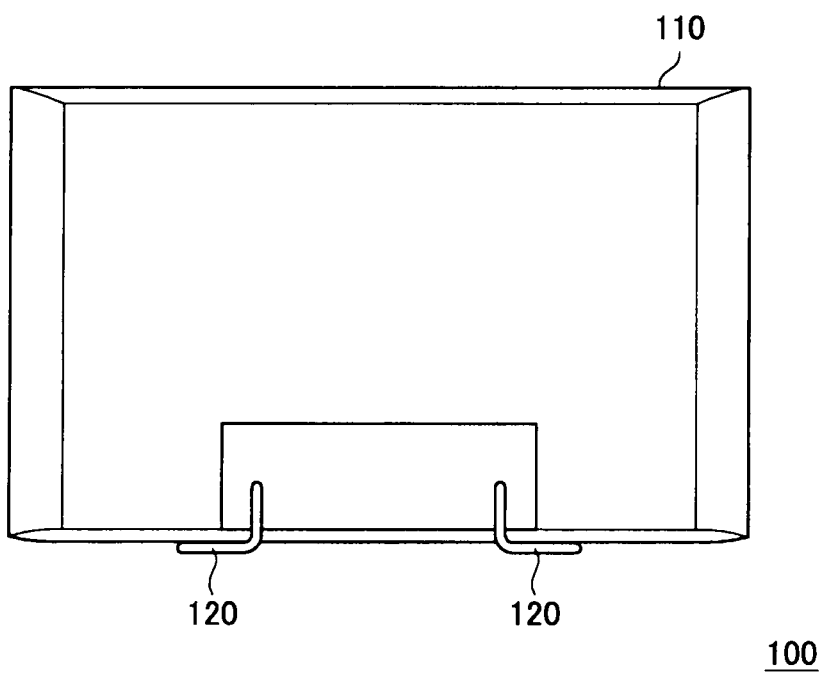
FIG. 3 is a schematic view illustrating the entire structure of the display apparatus according to the embodiment of the present invention.
Figure 4:
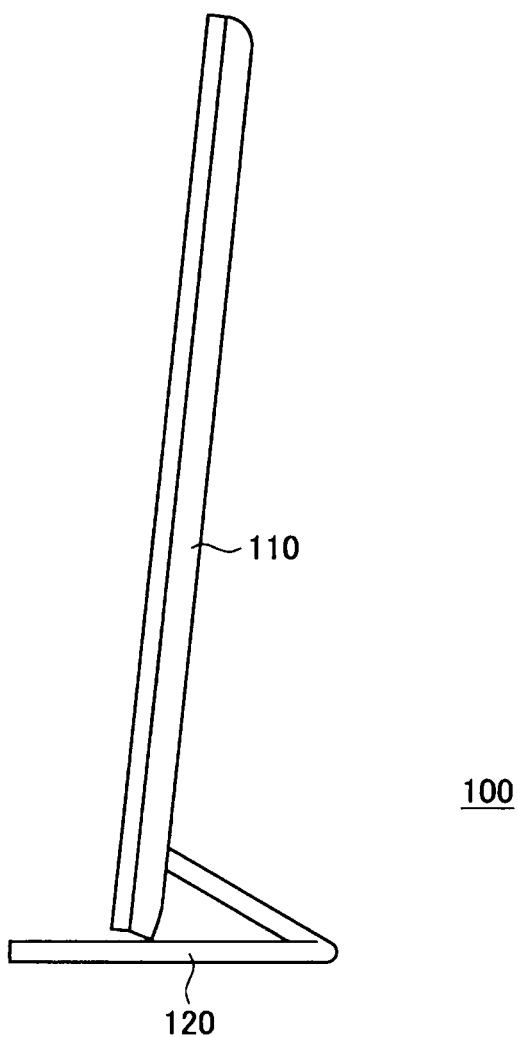
FIG. 4 is a schematic view illustrating the entire structure of the display apparatus according to the embodiment of the present invention.
Figure 5:
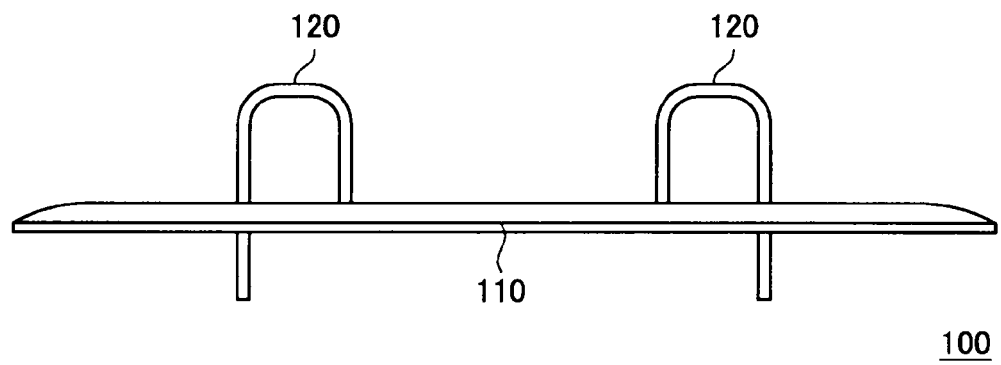
FIG. 5 is a schematic view illustrating the entire structure of the display apparatus according to the embodiment of the present invention.

FIGS. 1, 2, 3, 4, and 5 are schematic views each illustrating an entire structure of a display apparatus 100 according to an embodiment of the present invention. Herein, FIG. 1 is a perspective view of the display apparatus 100. FIG. 2 is a front view of the display apparatus 100. FIG. 3 is a back view of the display apparatus 100 when the display apparatus is seen from the back. FIG. 4 is a right side view of the display apparatus 100. FIG. 5 is a top view of the display apparatus 100 when the display apparatus 100 is seen from above.

The display apparatus 100 includes a display unit 110 structured as a thin tabular shape and support sections 120 for supporting the display unit 110. The display unit 110 has a display screen made of a liquid crystal display panel and the like. The support section 120 is made of a bent pipe (shaft). Totally two support sections 120 are arranged in such a manner that one support section 120 is arranged at the right and the other support section 120 is arranged at the left of the display apparatus 100 when the display apparatus is seen from the front.

<2. Details of Support Structure>

Figure 6:
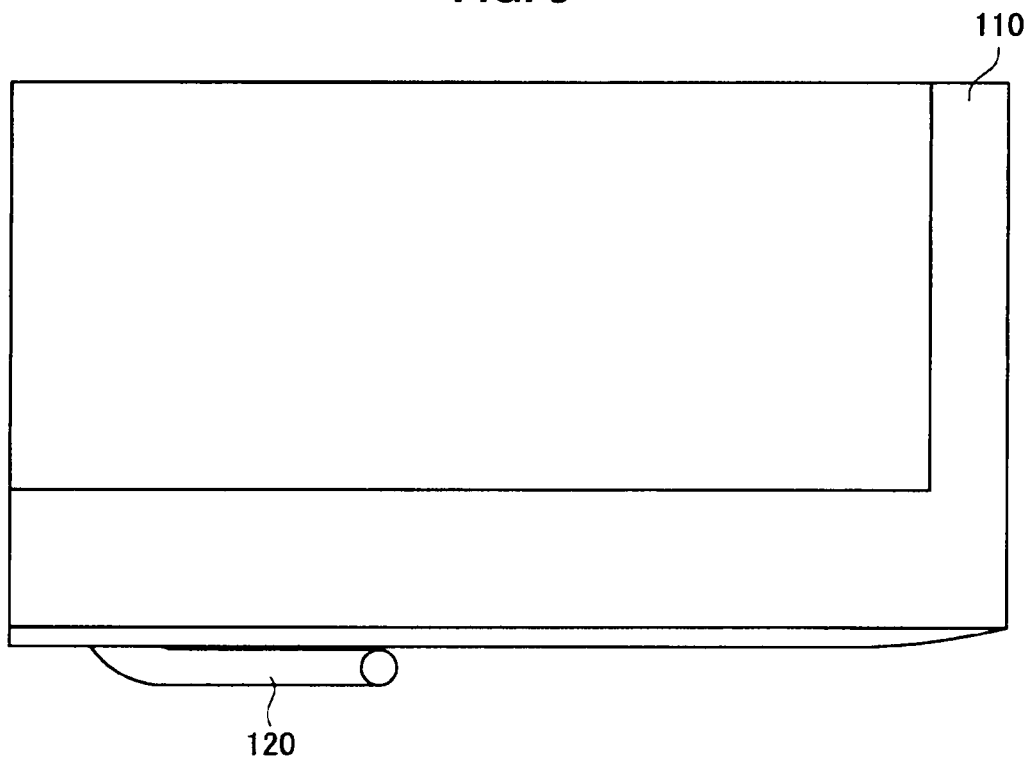
FIG. 6 is a magnified schematic view illustrating a support section and portions therearound when the display apparatus is seen from the front side.
Figure 7:
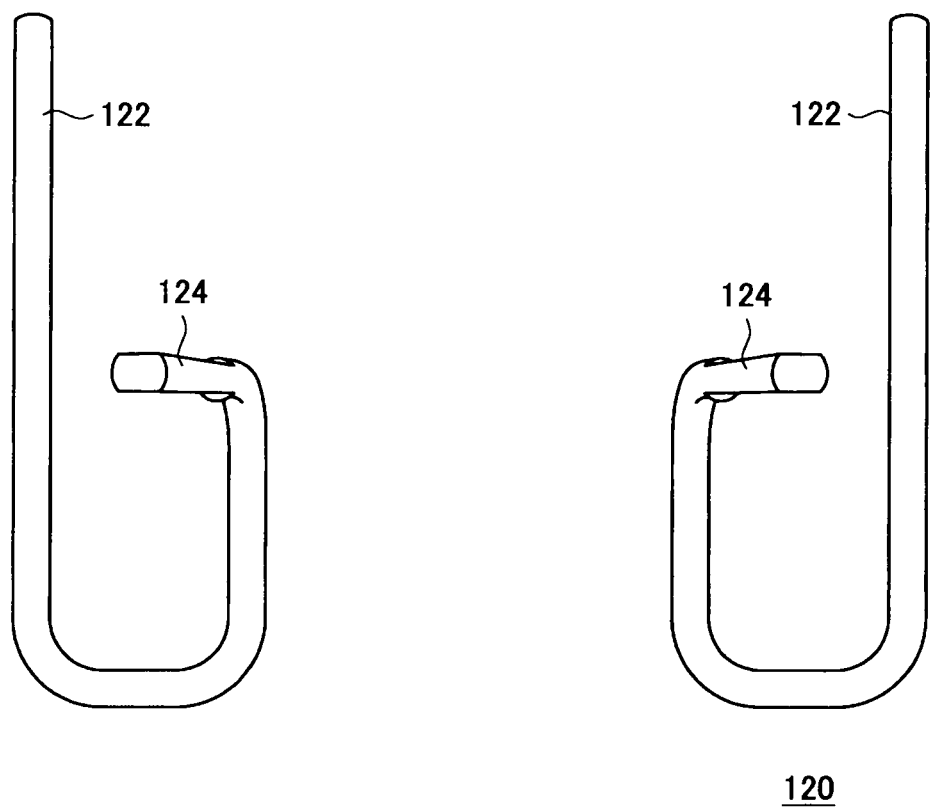
FIG. 7 is a schematic view illustrating the support section when the support section is seen from above.

FIG. 6 is a magnified schematic view illustrating the support section 120 and portions therearound when the display apparatus 100 is seen from the front side. FIG. 7 is a schematic view illustrating the support section 120 when the support section 120 is seen from above. Each of the support sections 120 includes a contact section 122 and an insertion section 124. The contact section 122 comes into contact with a floor surface on which the display apparatus 100 is placed. The insertion section 124 is inserted into a hole arranged on a back surface of the display unit 110. The bottom surface of the contact section 122 comes into contact with the floor surface on which the display apparatus 100 is placed. As shown in FIG. 6, an end face of a lower section of the display unit 110 comes into contact with an upper surface of the contact section 122. Therefore, a gap corresponding to a diameter of the pipe constituting the support section 120 is formed between the floor surface and the end face of the lower section of the display unit 110.

As shown in FIG. 7, the contact section 122 of the support section 120 has a U shape when the contact section 122 is seen from above. The insertion section 124 is formed vertically with respect to a surface formed by the contact section 122 (floor surface), and the insertion section 124 extends upward. Since the contact section 122 is formed in a U shape, the support section 120 can be stably placed on the floor surface.

Figure 8:
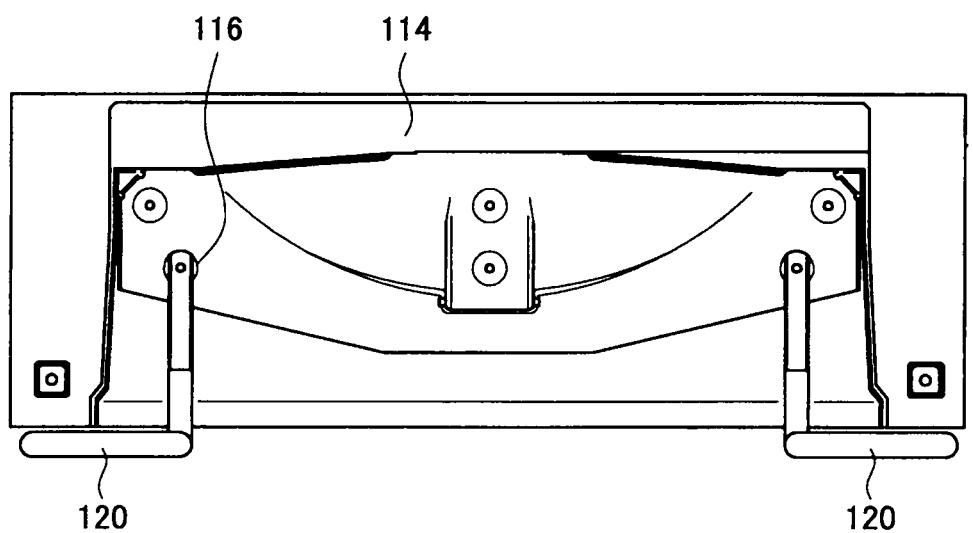
FIG. 8 is a schematic view illustrating a back surface of the display apparatus, where an insertion section of the support section is inserted into the display apparatus.

FIG. 8 is a schematic view illustrating a back surface of the display apparatus 100, where the insertion section 124 of the support section 120 is inserted into the display apparatus 100. The display apparatus 100 has holes 116 corresponding to the insertion sections 124. The insertion sections 124 are inserted into the holes 116 from the lower side. In the example shown in FIG. 8, the hole 116 is formed in the support plate 114 fixed to the back surface of the display unit 110.

As described above, the support section 120 is made of the bent pipe, and the display unit 110 is supported by the two support sections 120, i.e., the right and left support sections 120. Therefore, the display unit 110 can be reliably supported with an extremely simple structure.

Figure 9:
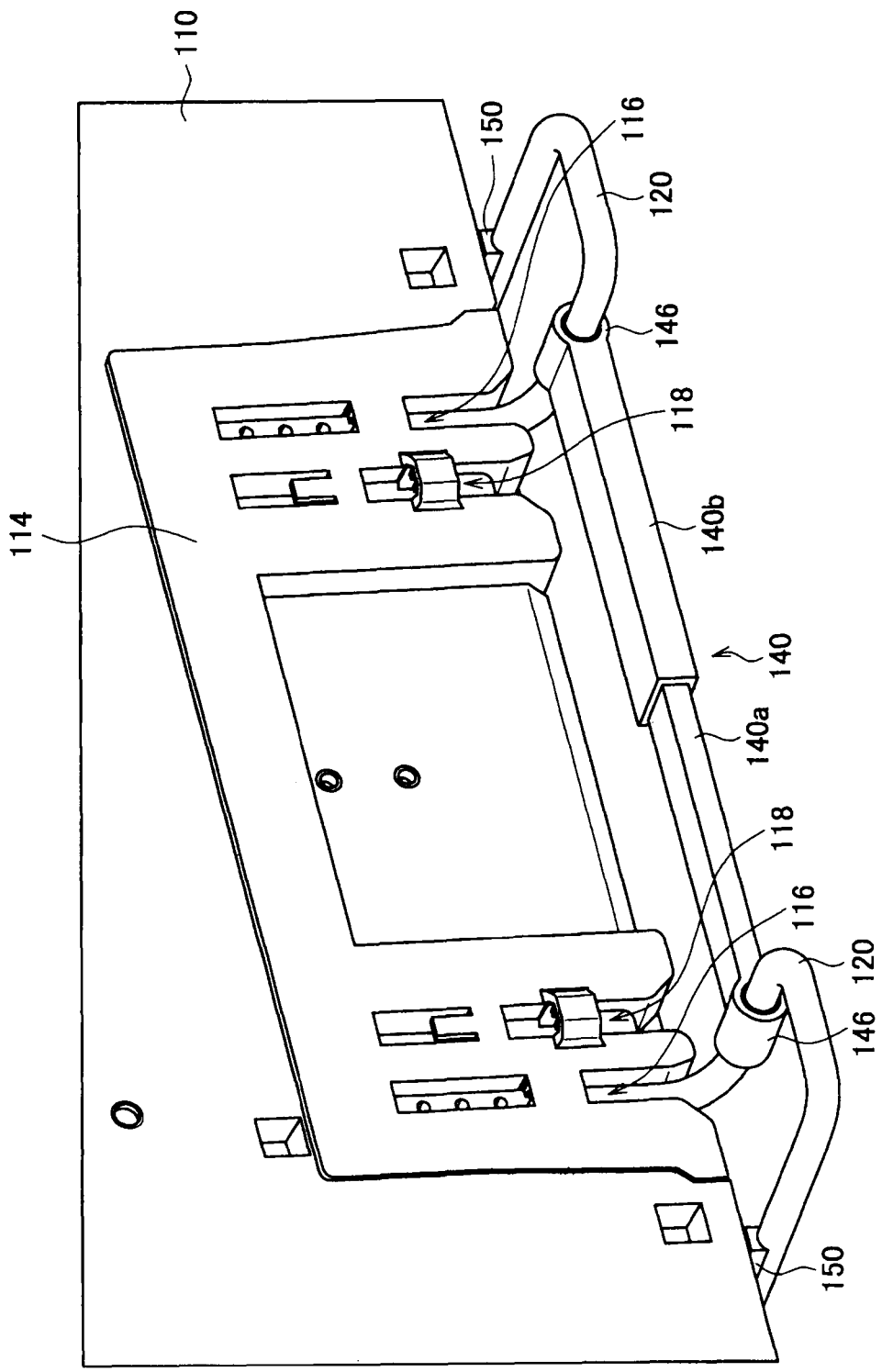
FIG. 9 is a schematic view illustrating an example where two holes having different inclinations are arranged on the back surface of the display apparatus.

FIG. 9 is a schematic view illustrating an example where two holes 116, 118 having different inclinations are arranged on the back surface of the display apparatus 100. In the example of FIG. 9, the tilt angle of the display unit 110 can be changed between when the insertion section 124 of the support section 120 is inserted into the hole 116 and when the insertion section 124 is inserted into the hole 118. For example, when the insertion section 124 is inserted into the hole 116, the tilt angle can be set at 0 degrees. When the insertion section 124 is inserted into the hole 118, the tilt angle can be set at 6 degrees.

As shown in FIG. 9, a pipe pitch adjustment bar 140 is coupled to the right and left support sections 120. The pipe pitch adjustment bar 140 has two bars 140a, 140b that can slide in a longitudinal direction. An interval between both-end coupling sections 146 coupled with the right and left support sections 120 can be set at a distance corresponding to one of an interval between the two holes 116 and an interval between the two holes 118. Accordingly, each of the right and left support sections 120 can be inserted into one of the hole 116 and the hole 118. As shown in FIG. 8, a cushion material 150 is inserted into the lower section of the display unit 110 at a position in contact with the support section 120.

Figure 10:
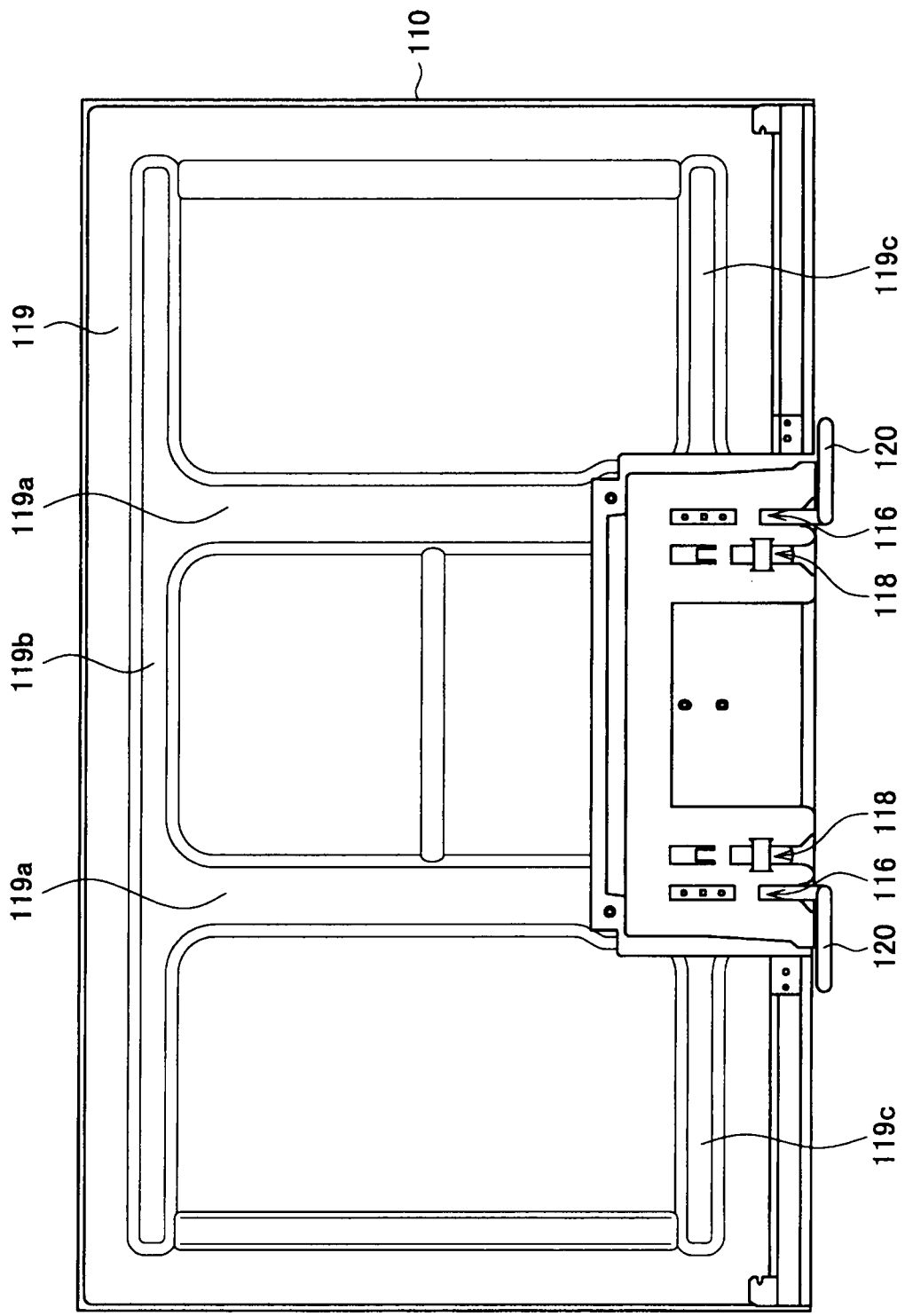
FIG. 10 is a schematic view illustrating an arrangement of holes and a panel plate arranged in the display unit.

FIG. 10 is a schematic view illustrating a positional relationship among holes 116, 118 and a panel plate 119 arranged in the display unit 110. The panel plate 119 is attached to the back of the liquid crystal display panel. Circuit boards and the like are attached to the panel plate 119. The panel plate 119 is made of a metal plate, and has a function of reinforcing the display unit 110. The panel plate 119 has a plurality of ribs 119a, 119b, 119c for reinforcement, which are made by press-working. The holes 116, 118 are arranged at positions corresponding to the ribs 119a in a vertical direction. Accordingly, the support section 120 can be attached to highly-rigid positions of the display unit 110, and thus can stably support the display unit 110.

Figure 11:
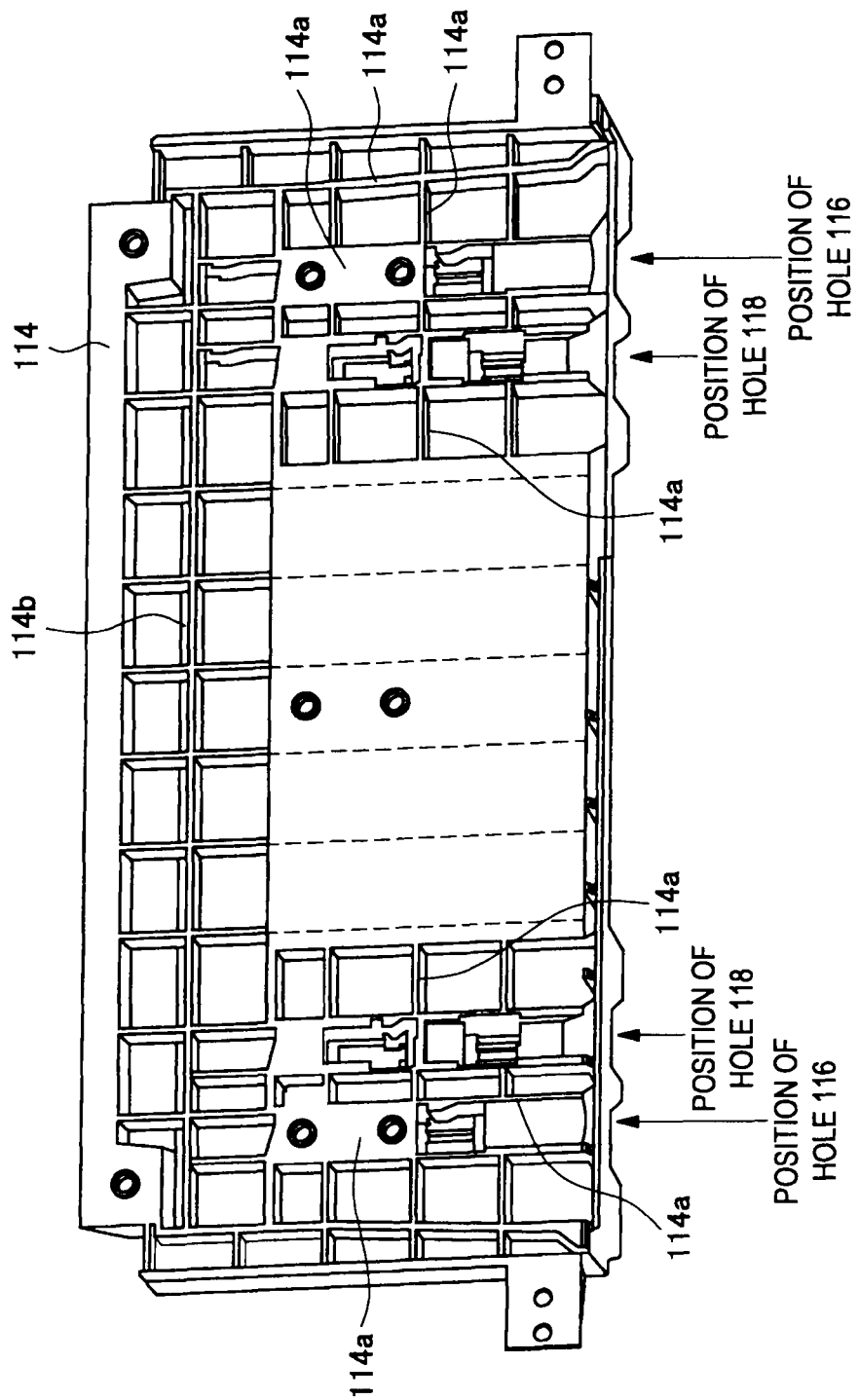
FIG. 11 is a schematic view illustrating a surface of a support plate at the side of the panel plate.

FIG. 11 is a schematic view illustrating a surface of the support plate 114 at the side of the panel plate 140. As shown in FIG. 11, the surface of the support plate 114 at the side of the panel plate 140 has the ribs 114a which are arranged along the holes 116, 118 for reinforcement. The rib 114b is arranged to connect the two ribs 114a along the upper end of the support plate 114. This structure can improve the rigidity of the support plate 114 in proximity to the holes 116, 118, and can stably support the display unit 110.

Figure 12:
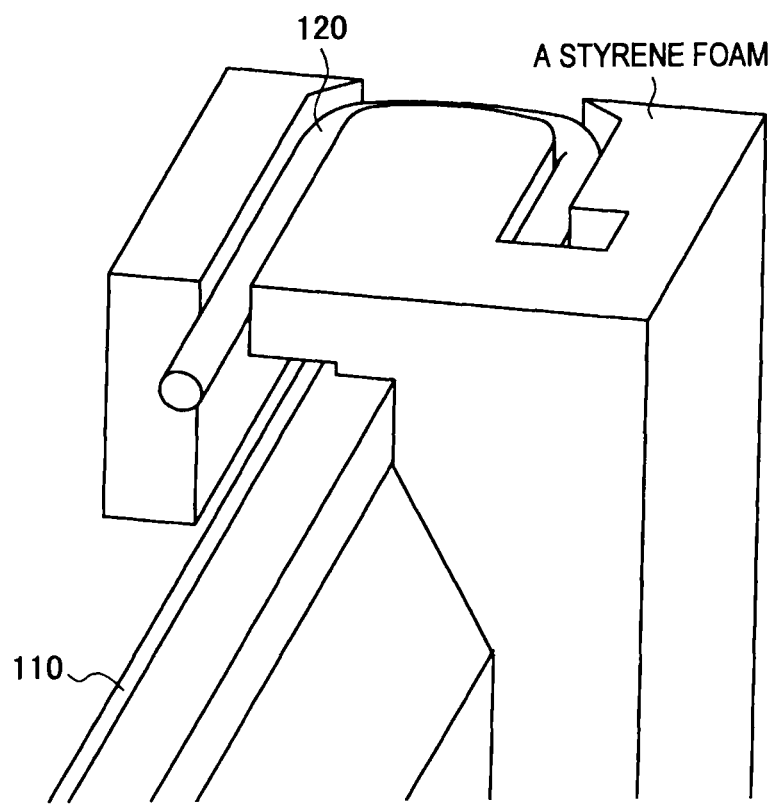
FIG. 12 is a schematic view illustrating how a support section is attached to a styrene foam supporting the display unit when the display apparatus is packed in a box.

FIG. 12 is a schematic view illustrating how the support section 120 is attached to a styrene foam supporting the display unit 110 when the display apparatus 100 is packed in a box. As described above, in the present embodiment, the support section 120 is made of the bent pipe. Therefore, the display apparatus 100 can be packed in a packing box having a minimum size. In particular, the display apparatus 100 can be packed in a packing box having a minimum size in a thickness direction of the display unit 110. As a result, a larger number of display apparatuses 100 packed in a smaller volume can be transported during, e.g., shipment, which greatly reduces the transport cost.

Figure 13:
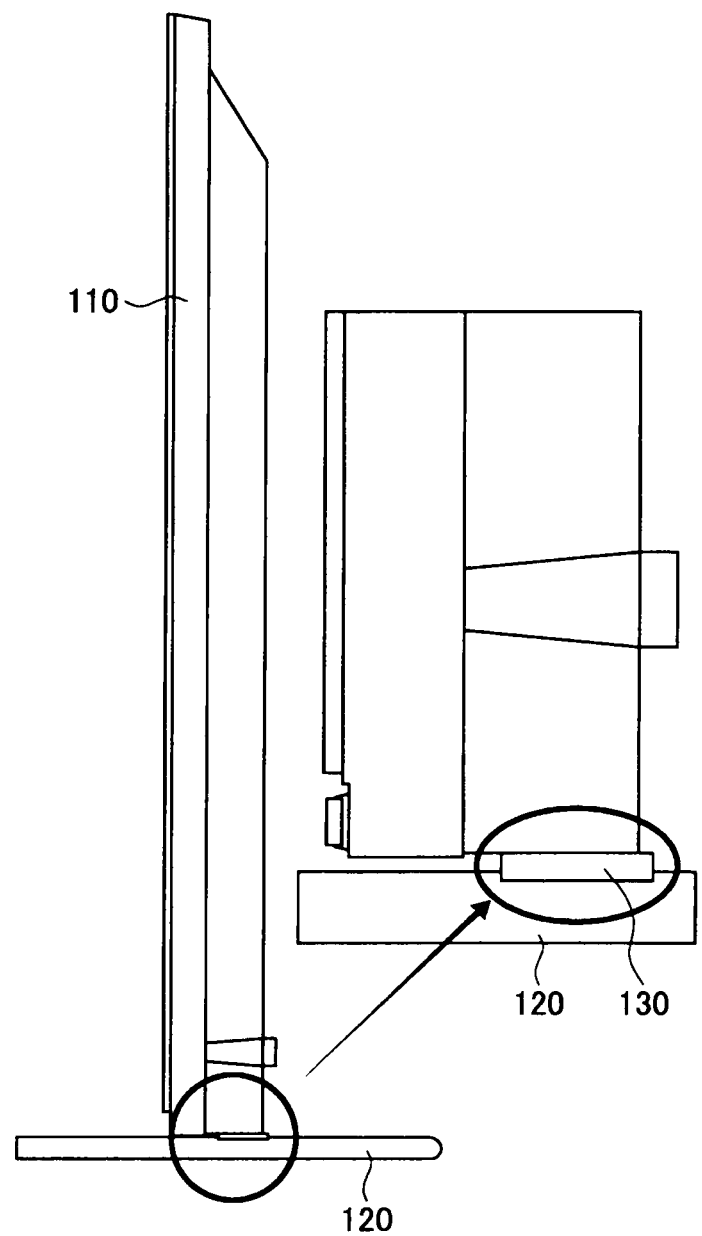
FIG. 13 is a schematic view illustrating the display unit and the support section when they are seen from the right side.
Figure 14:
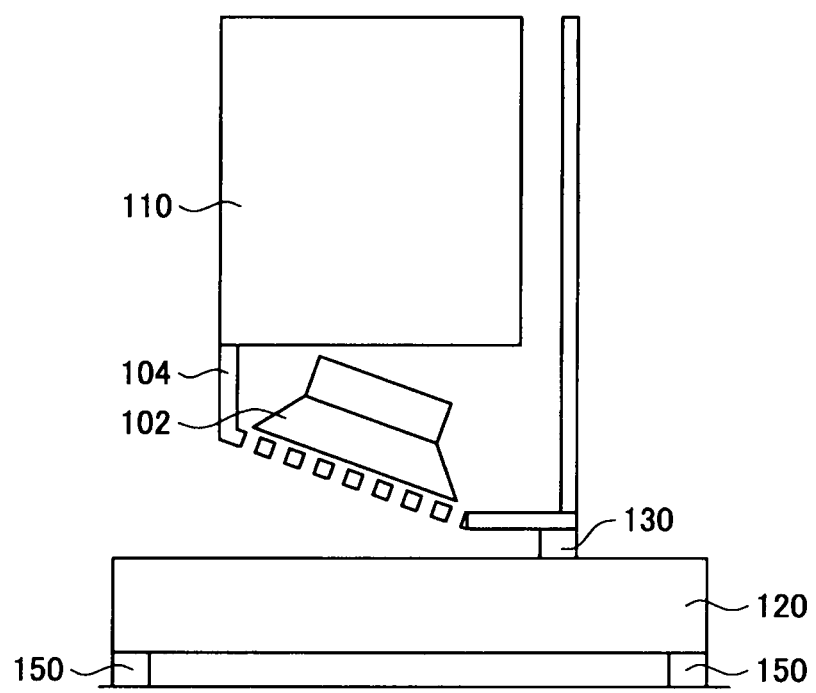
FIG. 14 is a schematic view illustrating the display unit and the support section when they are seen from the right side.

FIGS. 13 and 14 are schematic views each illustrating the display unit 110 and the support section 120 when they are seen from the right side. As described above, the cushion material 150 is arranged between the support section 120 and the lower end of the display unit 110. In addition, the cushion material 150 is arranged on the lower surface of the support section 120. In this structure, when the display apparatus 100 is moved in a horizontal direction, the cushion material 150 interposed between the support section 120 and the floor surface enables smooth movement and prevents the floor surface from being scratched.

Figure 15A:
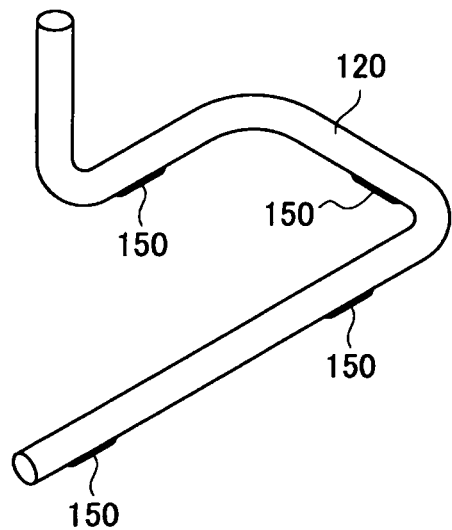
FIG. 15A is a view illustrating an arrangement of cushion materials.
Figure 15B:
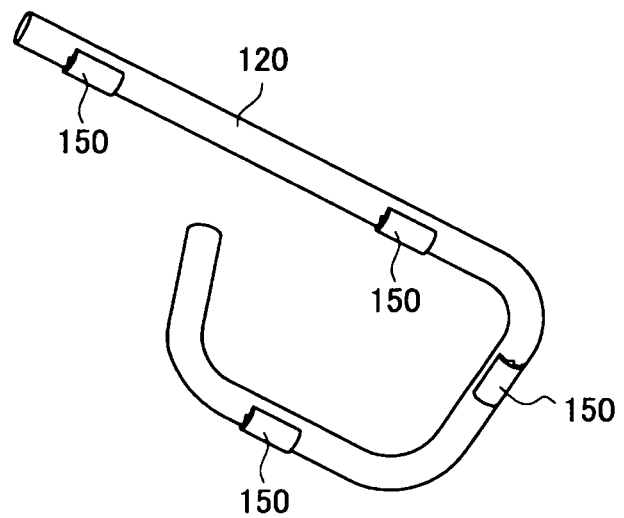
FIG. 15B is a view illustrating an arrangement of cushion materials.

FIGS. 15A and 15B are views each illustrating an arrangement of the cushion materials 150. FIG. 15A illustrates the support section 120 when the support section 120 is seen from obliquely above. FIG. 15B illustrates the support section 120 when the support section 120 is seen from obliquely below. In the examples as shown in FIGS. 15A and 15B, four cushion materials 150 are attached to the support section 120.

Figure 16:
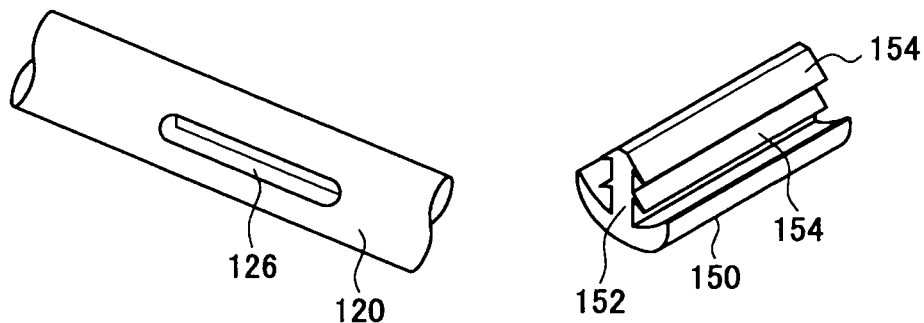
FIG. 16 is a perspective view illustrating structures of a cushion material and an attachment hole formed in the support section.
Figure 17:
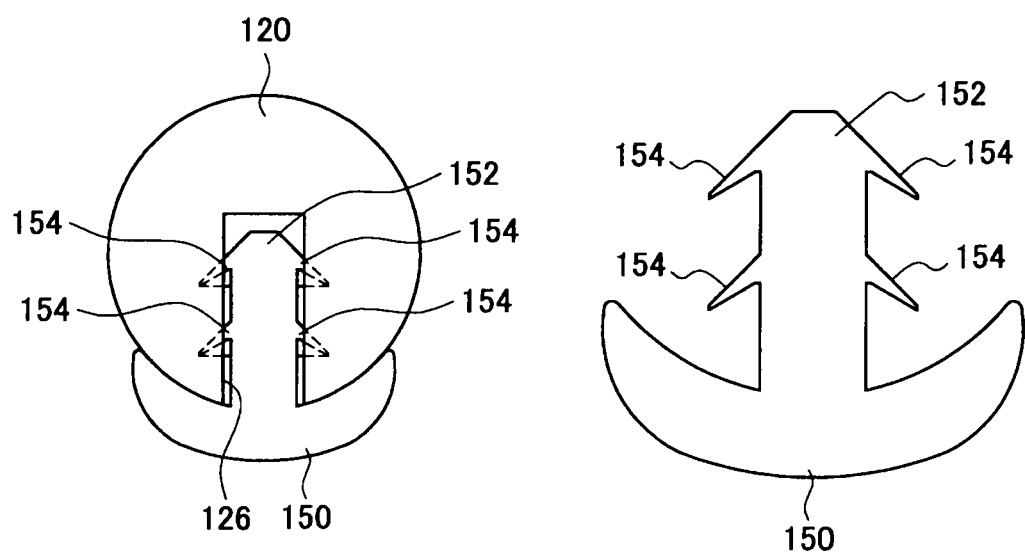
FIG. 17 is a schematic view illustrating cross sections of the support section and the cushion material.

FIG. 16 is a perspective view illustrating structures of the cushion material 150 and the attachment hole 126 formed in the support section 120. FIG. 17 is a schematic view illustrating cross sections of the support section 120 and the cushion material 150. The cushion material 150 is provided with an insertion section 152 inserted into the attachment hole 126. The insertion section 152 is provided with barb-shaped sections 154. The barb-shaped sections 154 are arranged to reliably prevent detachment of the cushion material 150 from the support section 120.

The material of the cushion material 150 may be a resin material such as polyacetal resin (POM: polyoxymethylene). Silicon rubber may be used as the cushion for the stand.

As shown in FIG. 14, a speaker 102 for outputting sounds of the display apparatus 100 is arranged at a lower section of the display unit 110 at the back of the front cover 104 of the casing. In this structure, the speaker 102 is hidden from the users. This structure improves the quality of the visual design.

Figure 18:
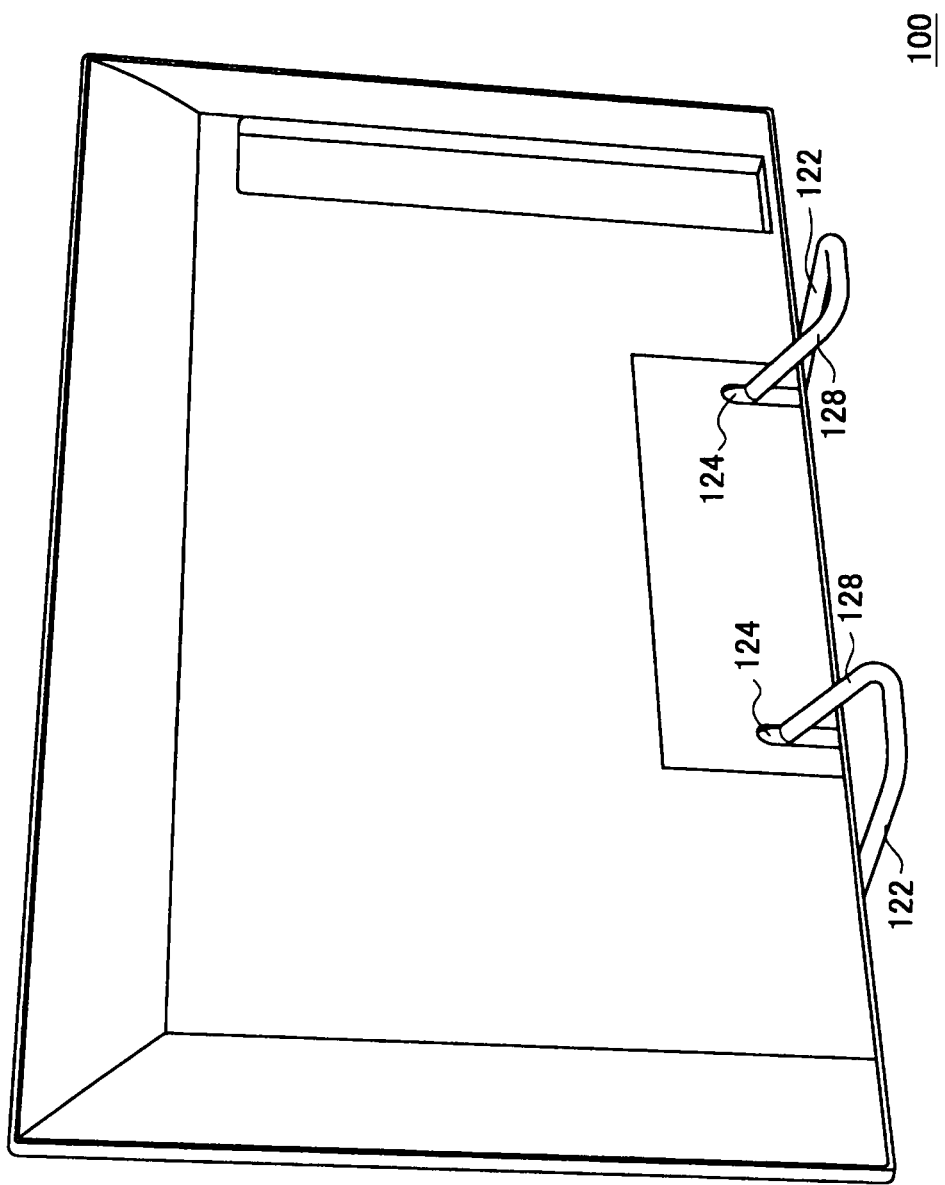
FIG. 18 is a view illustrating a back surface of the display apparatus.

FIG. 18 is a figure illustrating a back surface of the display apparatus 100 as another example of the support sections 120. In the example shown in FIG. 18, a connection section 128 is arranged to extend in an oblique direction between the insertion section 124 and the contact section 122 of the support section 120. In the structure as shown in FIG. 18, two support sections 120 are arranged at the right and the left. Therefore, the support sections 120 can stably support the display unit 110.

Figure 19:
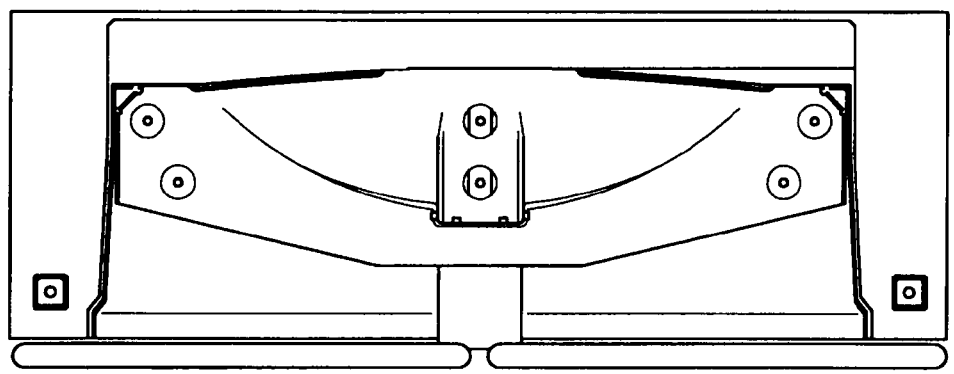
FIG. 19 is a schematic view illustrating an example where right and left support sections are integrally formed, and one insertion section is inserted into a hole arranged in proximity to the center of the display unit.

In the example of FIG. 19, right and left support sections 120 are integrally formed, and one insertion section 124 is inserted into a hole in proximity to the center of the display unit. As described above, the number of support sections 120 is not limited to two. One or three or more support sections 120 may be arranged.

<3. Exemplary Configuration of Tilt Mechanism>

Figure 20:
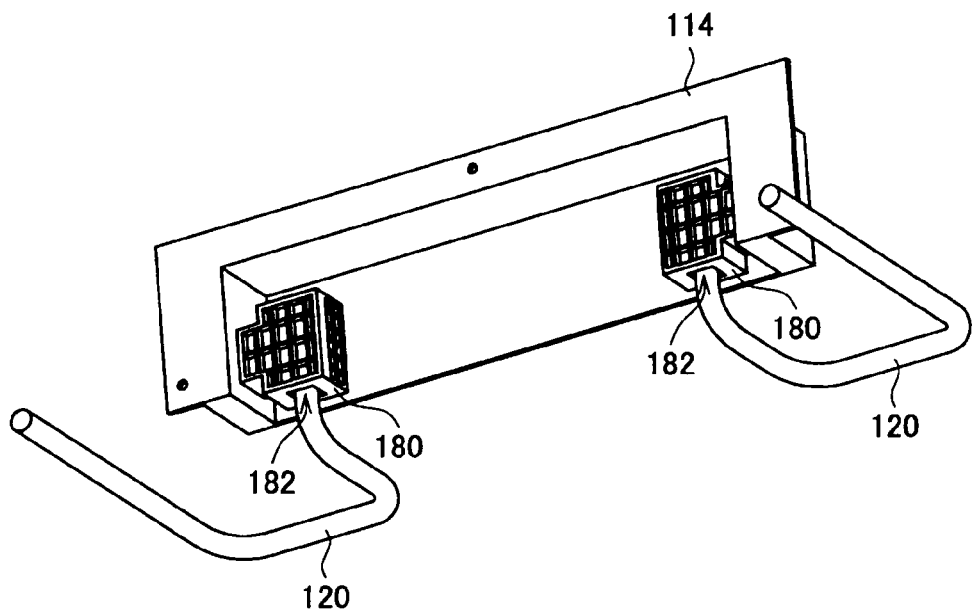
FIG. 20 is a schematic view illustrating an exemplary configuration of a tilt mechanism.
Figure 21:
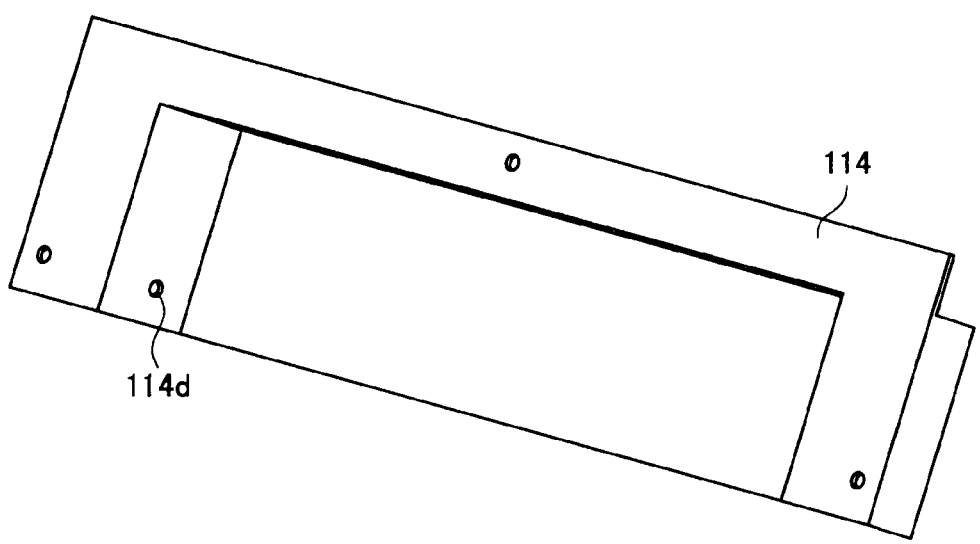
FIG. 21 is a schematic view illustrating an exemplary configuration of a support plate 114 in a case where a tilt mechanism is arranged.

Subsequently, a tilt mechanism for tilting the display unit 110 of the display apparatus 100 will be explained. FIG. 20 is a schematic view illustrating an exemplary configuration of a tilt mechanism. FIG. 21 is a schematic view illustrating an exemplary configuration of a support plate 114 in a case where a tilt mechanism is arranged. FIG. 21 is a schematic view illustrating an exemplary configuration of a hinge 180.

The tilt mechanism is constituted by arranging the hinge 180 that can rotate with respect to the support plate 114. The hinge 180 has a hole 182 into which the insertion section 124 of the support section 120 is inserted.

The hinge 180 has a shaft 184 that is inserted into an insertion hole 114d of the support plate 114. The hinge 180 is made of a resin material such as polyacetal resin. The shaft 184 is made of metal such as steel, and is configured to be rotatable with respect to the hinge 180. The shaft 184 is fixed to the insertion hole 114d of the support plate 114.

Figure 23A:
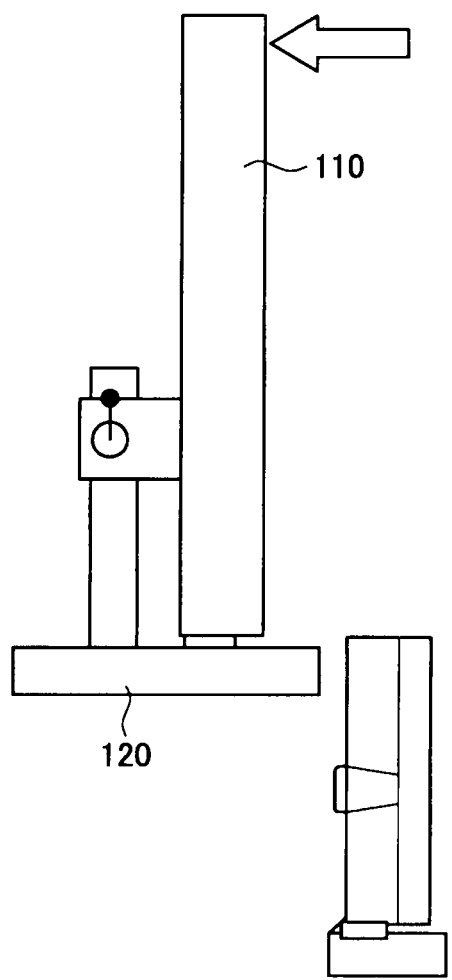
FIG. 23A is a schematic view illustrating an operation when the display unit is tilted with a tilt mechanism.
Figure 23B:
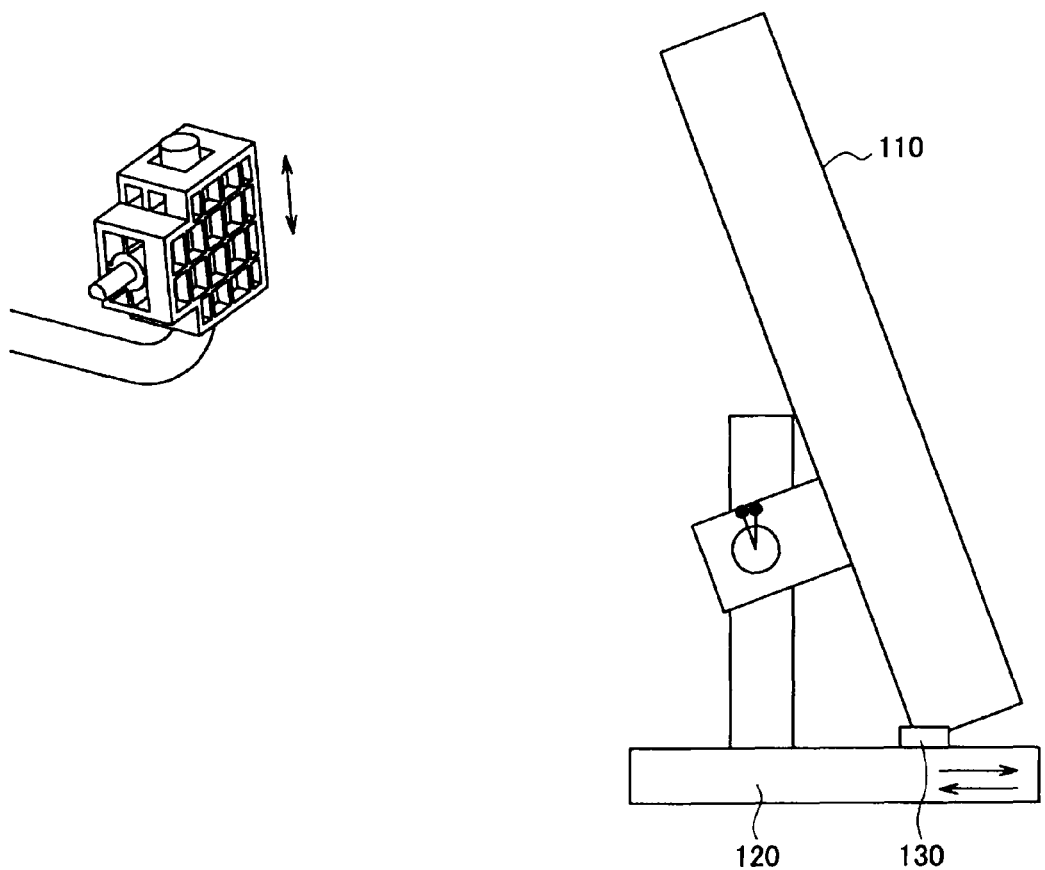
FIG. 23B is a schematic view illustrating an operation when the display unit is tilted with a tilt mechanism.

FIGS. 23A and 23B are schematic views each illustrating operation when the display unit 110 is tilted with a tilt mechanism. FIG. 23A illustrates a state in which the display unit 110 is not tilted (0 degrees position). FIG. 23B illustrates a state in which the display unit 110 is tilted 6 degrees (6 degrees position).

In the 0 degrees position as shown in FIG. 23A, the load of the set is received by the pipe of the support section 120 via the cushion material 130, so that the load and the torque applied to the tilt mechanism portion is reduced.

In the process of transition from the 0 degrees position to the 6 degrees position, an interface between steel of the shaft 184 and POM of the hinge 180 is rotated by the force applied by the user. According to this rotation, the display unit 110 moves vertically by its own weight, which causes the position of the insertion section 124 to slide with respect to the hole 182. In this case, the hinge 180 is made of POM, but the pipe of the insertion section 124 of the support section 120 is made of metal. Accordingly, the insertion section 124 slides with respect to the hole 182, and the display unit 110 slides vertically without any resistance. Since the shaft 184 of the hinge 180 is made of steel and the hinge 180 is made of POM, an operational torque can be generated by the interface between the shaft 184 and the hinge 180. When the display unit 110 is tilted, the cushion material 130 attached to the bottom surface of the display unit 110 is caused to slide on the pipe of the support section 120. Therefore, an operational torque can be generated by a resistance caused by frictional force (between the pipe and the set). As described above, even when the display unit 110 is tilted, the display unit 110 moves vertically so that the load of the set is received by the pipe. Therefore, the tilting operational force can be generated by using the weight of the display unit 110 itself.

It should be understood by those skilled in the art that various modifications, combinations, sub-combinations and alterations may occur depending on design requirements and other factors insofar as they are within the scope of the appended claims or the equivalents thereof.

For example, in the above embodiment, the U-shaped bent portions of the two pipe stands (the support sections 120) are arranged at the back side of the display unit 110. Alternatively, the U-shaped bent portions may be arranged on the front side (display surface side) of the panel of the display unit 110. The cross sectional shape of the pipe constituting the support section 120 may have various shapes such as an elliptic shape and a square shape. Further, the end of the pipe constituting the support section 120 may be rounded, or may be cut diagonally.

The present application contains subject matter related to that disclosed in Japanese Priority Patent Application JP 2010-019085 filed in the Japan Patent Office on Jan. 29, 2010, the entire content of which is hereby incorporated by reference.

What is claimed is:

1. A display apparatus comprising:
  a tabular display unit having a display screen for displaying an image; and
  a support section constituted by a bent stick member, wherein
  one end of the support section is inserted into a hole arranged on a back surface of the display unit from a lower side, and the support section is arranged between, and in direct contact with, a placement surface and a lower end of the display unit, whereby the support section supports the display unit from the lower side
  wherein the support section is constituted by a first bent stick member and a second bent stick member, the first bent stick member is independent from, and not in direct contact, with the second bent stick member, and wherein a first end of the first bent stick member is inserted into a first hole arranged on the back surface of the display unit from the lower side, and the first bent stick member is arranged between, and in direct contact with, the placement surface and the lower end of the display unit, and a second end of the second bent stick member is inserted into a second hole arranged on the back surface of the display unit from the lower side, and the second bent stick member is arranged between, and in direct contact with, the placement surface and the lower end of the display unit.

2. The display apparatus according to claim 1, wherein the support section is formed such that a portion coming into contact with the placement surface is formed in a U shape.

3. The display apparatus according to claim 1, wherein the hole formed in the back surface of the display unit comprises a plurality of holes having different angles with respect to a vertical direction, and a tilt angle of the display unit can be changed by inserting the one end of the support section into a different hole.

4. The display apparatus according to claim 1, wherein the back surface of the display unit is provided with a hinge that can rotate in a tilt direction with respect to the display unit, and the one end of the support section is inserted into a hole arranged in the hinge.

5. A display apparatus comprising
a tabular display unit having a display screen for displaying an image; and
a support section constituted by a bent stick member, wherein
one end of the support section is inserted into a hole arranged on a back surface of the display unit from a lower side, and the support section is arranged between a placement surface and a lower end of the display unit, whereby the support section supports the display unit from the lower side,
the hole formed in the back surface of the display unit comprises a plurality of holes having different angles with respect to a vertical direction, and a tilt angle of the display unit can be changed by inserting the one end of the support section into a different hole, and
two support sections are respectively arranged at right and left of the display unit, and a pitch adjustment bar is arranged to define a gap between the support sections in order to allow the support sections to be inserted into the two holes having the same angle with respect to the vertical direction.

* * * * *